(12) United States Patent
Narasimha et al.

(10) Patent No.: US 10,591,548 B2
(45) Date of Patent: Mar. 17, 2020

(54) WINDING FAULT DETECTION USING INVERTER HARMONICS

(71) Applicant: TEXAS INSTRUMENTS INCORPORATED, Dallas, TX (US)

(72) Inventors: Rajan Lakshmi Narasimha, Dallas, TX (US); David Patrick Magee, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/154,451

(22) Filed: Oct. 8, 2018

(65) Prior Publication Data

US 2019/0041462 A1 Feb. 7, 2019

Related U.S. Application Data

(63) Continuation of application No. 15/631,907, filed on Jun. 23, 2017, now Pat. No. 10,094,878.

(51) Int. Cl.
*H02K 17/32* (2006.01)
*G01R 31/34* (2020.01)
*H02K 11/20* (2016.01)

(52) U.S. Cl.
CPC ......... *G01R 31/346* (2013.01); *G01R 31/343* (2013.01); *H02K 11/20* (2016.01)

(58) Field of Classification Search
CPC ..... G01R 31/343; G01R 31/346; H02K 11/20
See application file for complete search history.

(56) References Cited

U.S. PATENT DOCUMENTS

| 3,732,464 A | 5/1973 | Miki et al. |
| 4,455,612 A | 6/1984 | Girgis et al. |
| 6,483,435 B2 | 11/2002 | Saha et al. |
| 7,728,537 B2 | 6/2010 | Tomigashi |
| 8,330,438 B2 | 12/2012 | Sreenivas |
| 9,581,649 B2 | 2/2017 | Narasimha et al. |

(Continued)

OTHER PUBLICATIONS

Grubic et al., "A Survey on Testing and Monitoring Methods for Stator Insulation Systems of Low-Voltage Induction Machines Focusing on Turn Insulation Problems", IEEE Transactions on Industrial Electronics, vol. 55, No. 12, Dec. 2008, pp. 4127-4136.

(Continued)

*Primary Examiner* — Karen Masih
(74) *Attorney, Agent, or Firm* — Michael A. Davis, Jr.; Charles A. Brill; Frank D. Cimino

(57) ABSTRACT

A controller for driving a motor includes a multiphase driver, an analog-to-digital converter (ADC), impedance estimation circuitry, and fault detection circuitry. The multiphase driver is configured to generate drive signals for energizing each motor phase winding. The ADC is configured to digitize voltage and current from each motor phase winding. The impedance estimation circuitry is configured to determine a phasor value for the digitized voltages and for the digitized currents at a predetermined harmonic frequency, and to determine a sequence impedance value based on the phasor values. The fault detection circuitry is configured to identify a fault in the windings of the motor based on the sequence impedance value.

16 Claims, 4 Drawing Sheets

(56) References Cited

U.S. PATENT DOCUMENTS

2016/0041228 A1* 2/2016 Gerada ............... G01R 31/346
 324/765.01
2016/0261222 A1 9/2016 Hatanaka

OTHER PUBLICATIONS

Lee et al., "An On-Line Stator Turn Fault Detection Method for Interior PM Synchronous Motor Drives", IEEE, Applied Power Electronics Conference, Feb. 25-Mar. 1, 2007, pp. 825-831.
Lee et al., "A Robust, On-Line Turn-Fault Detection Technique for Induction Machines Based on Monitoring the Sequence Component Impedance Matrix", IEEE Transactions on Power Electronics, vol. 18, No. 3, May 2003, pp. 865-872.

* cited by examiner

WINDING FAULT DETECTION USING INVERTER HARMONICS

CROSS REFERENCE TO RELATED APPLICATION(S)

This application is a continuation of U.S. patent application Ser. No. 15/631,907 filed Jun. 23, 2017, which is hereby incorporated by reference in its entirety.

BACKGROUND

AC induction motors as well as other types of motors (e.g., permanent magnet, switched reluctance, etc.) are driven by a multiphase inverter that provides a pulse width modulated (PWM) voltage to each phase of the motor. Degradation or faults in the motor windings can contribute to motor failures or degradation of the motor windings and/or the power source. Accordingly, detecting the onset of motor winding degradation can be useful for proactive maintenance of the motor to avoid or mitigate the onset of overheating and/or stator winding insulation breakdown and the eventual motor failure.

SUMMARY

A method and apparatus for controlling, and detecting faults in the windings of an electric machine are disclosed herein. In one embodiment, a controller for driving a motor includes a multi-phase driver, an analog-to-digital converter (ADC), impedance estimation circuitry, and fault detection circuitry. The multiphase driver is configured to generate drive signals for energizing each of a plurality of phase windings of the motor. The ADC is configured to digitize the voltage and current from each of the motor phase windings. The impedance estimation circuitry is configured to determine phasor values for the digitized voltages and for the digitized currents at a predetermined driver harmonic frequency, and to determine a sequence impedance value based on the phasor values. The fault detection circuitry is configured to identify a fault in the phase windings of the motor based on the sequence impedance value.

In another embodiment, a method for driving a motor includes generating drive signals to energize each of a plurality of phase windings of the motor. The voltage and current for each of the phase windings are digitized. Phasor values for the digitized voltages and currents at a predetermined inverter harmonic frequency are determined. A sequence impedance value is determined based on the phasor values. A fault in the phase windings of the motor is identified based on the sequence impedance value.

In a further embodiment, a system for detecting faults in a multiphase winding includes a driver, an analog front end, an ADC, and a processor. The driver is configured to generate signals to drive each of a plurality of windings of the multiphase winding. The driver includes a pulse width modulator to generate the signals, and each of the signals is a pulse width modulated signal. The analog front end includes low-pass filters configured to receive voltage signals and current signals. The low-pass filters attenuate frequency components of the voltage signals and the current signals that are higher than a predetermined cut-off frequency. The ADC is configured to digitize the filtered voltage and current signals output by the analog front end. The processor is configured to determine phasor values for the digitized voltage and current signals at a predetermined frequency. The predetermined frequency is an inverter harmonic frequency of the signal that drives the windings. The processor is also configured to determine a sequence impedance value based on the phasor values, and to identify a fault in the windings based on the sequence impedance value.

BRIEF DESCRIPTION OF THE DRAWINGS

For a detailed description of various examples, reference will now be made to the accompanying drawings in which.

DETAILED DESCRIPTION

Certain terms are used throughout the following description and claims to refer to particular system components. As one skilled in the art will appreciate, different companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of additional factors.

Conventional motor control systems may apply one of a variety of diagnostic techniques to identify anomalies in motor operation. For example, a conventional technique may evaluate bearing fault signatures in the current signal spectrum produced at fault frequencies. This technique is limited to bearing fault diagnosis, and performing fault diagnostics with the current signal alone leads to potential false alarms arising out of factors such as voltage imbalance that could lead to similar signatures in the current spectrum as the fault signal. Some conventional systems may also include winding fault detection based on sequence impedance. However, such systems fail to include analysis of information contained in inverter harmonics.

Embodiments of the present disclosure include a motor diagnostics system that evaluates sequence impedance and analyzes the information contained in the higher order inverter harmonics to identify faults in the windings of motor. Analysis of higher order inverter harmonics advantageously evaluates the sequence impedance in a signal band where the changes in impedance are larger than in the baseband frequency range, thereby leading to a higher signal to noise ratio and more robust fault detection.

Figure 1:
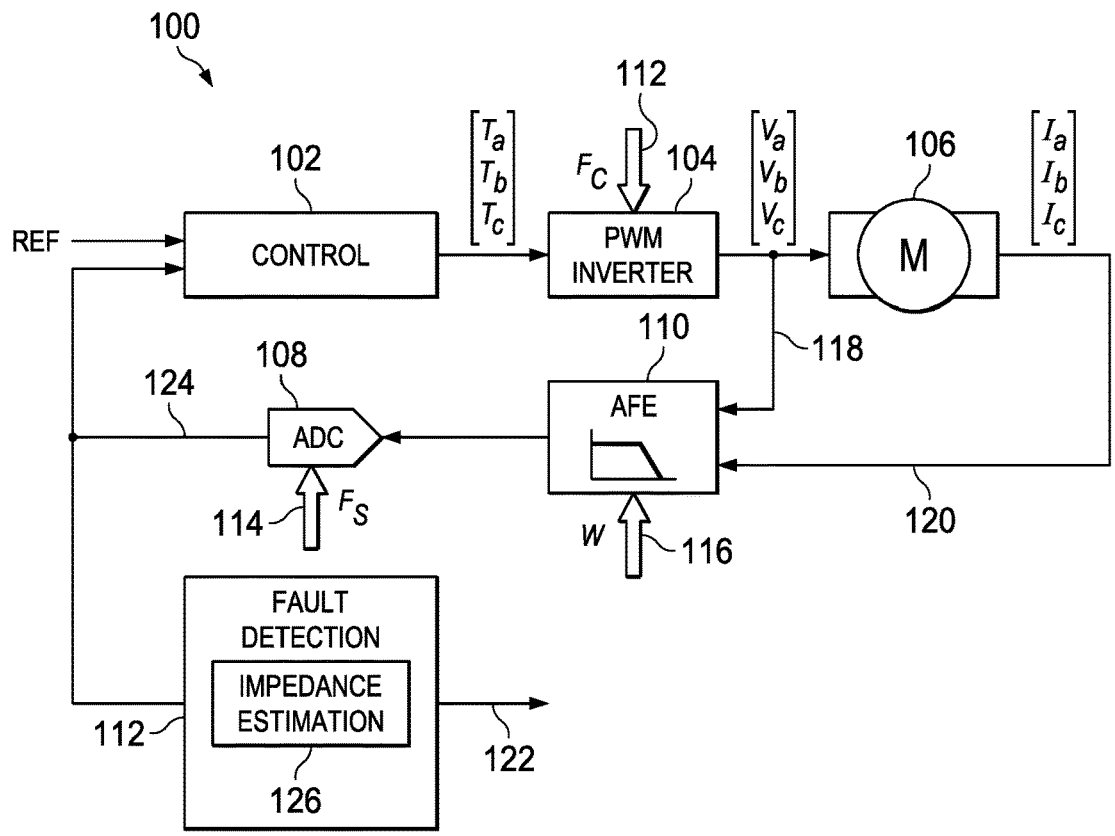
FIG. 1 shows a block diagram of a motor control and diagnostics system that employs inverter harmonics to identify faults in the motor windings in accordance with various embodiments.

FIG. 1 shows a block diagram of a motor control and diagnostics system 100 that employs inverter harmonics to identify faults in the motor windings in accordance with various embodiments. The system 100 includes control circuitry 102, pulse width modulated (PWM) inverter circuitry 104, analog front end circuitry 110, an analog-to-digital converter 108, and fault detection circuitry 112. A motor 106 is also shown in FIG. 1 to provide context for the control and diagnostic functionality of the system 100. The motor 106 is driven by the PWM inverter circuitry 104 and the fault detection circuitry 112 identifies faults in the windings of the motor 112.

The PWM inverter circuitry 104 includes a three phase inverter and a pulse width modulator that convert a DC input voltage into a pulse width modulated three-phase AC voltage that creates phase currents to drive the multiphase windings of the motor 106. Thus, the PWM inverter circuitry 104 operates as a multiphase driver that generates PWM signals to drive each winding of the motor 106. The signal that drives each winding is a pulse width modulated signal. Some embodiments control the frequency ($F_C$) of the PWM carrier via a parameter provided to the PWM inverter circuitry 104. The control circuitry 102 manages the operation of the PWM inverter circuitry 104. For example, some embodiments of the control circuitry 102 generate target values $T_a$, $T_b$, and $T_c$ that the PWM inverter circuitry 104 applies to produce corresponding phase voltages $V_a$, $V_b$, and $V_c$ that produce currents $I_a$, $I_b$, and $I_c$ flowing in the windings of the motor 106.

The voltages 118 across the motor 106 and the resulting currents 120 flowing in the motor 106 are received and processed by the analog front end 110. For example, some embodiments of the analog front end 110 include filters that attenuate high frequency components of the voltage and current signals from the motor 106. In some embodiments, the bandwidth or cut-off frequency (W) of the filters is configured by proper component selection in the analog front end 110. The voltage and current signals filtered by the analog front end 110 are digitized by the ADC 108. The ADC 108 is a successive approximation register (SAR) converter, a sigma delta ($\Sigma\Delta$) converter, a flash converter, or other type of converter that employs any of a variety of other digitization techniques. In some embodiments, the ADC 108 digitizes the input signal to a resolution of 12 bits, 16 bits, or any number of bits suitable to adequately capture the dynamic range needed to control the motor 106, which includes harmonics about the PWM carrier frequency. In some embodiments, the sampling frequency ($F_S$) of the ADC 108 is controlled by a parameter provided to the ADC 108.

The fault detection circuitry 112 processes the digitized voltage and current signals 124 to identify faults in the windings of the motor 106. More specifically, the fault detection circuitry 112 includes impedance estimation circuitry 126 that evaluates the sequence impedance, as against current harmonic magnitude. The fault detection circuitry 112 applies the information contained in the higher order inverter harmonics to identify faults in windings of the motor 106. Thus, the fault detection circuitry 112 advantageously evaluates sequence impedance in a signal band (e.g., the band of the higher order inverter harmonics) in which the changes in winding impedance are larger than those in the baseband frequency range, thereby leading to higher signal to noise ratio and more robust fault detection.

In some embodiments of the system 100, the fault detection circuitry 112 and/or the control circuitry 102 includes a processor, such as a general-purpose microprocessor, a digital signal processor, a microcontroller, or other instruction execution device that executes instructions to perform the functions disclosed herein. For example, in some embodiments, a processor executes instructions to set the sampling frequency of the ADC 108, set the carrier frequency of the PWM inverter circuitry 104, determine phasor values of voltage and current signals, evaluate sequence impedance of the motor 106 using higher order harmonic frequencies generated by the PWM inverter circuitry 104, and/or identify faults in windings. In some embodiments, instructions executed by a processor are stored in a computer-readable medium, such as a random access memory, non-volatile storage (e.g., FLASH storage, read-only-memory), or combinations thereof. In some embodiments of the system 100, the ADC 108 is a sub-component of the processor that implements the fault detection circuitry 112 and/or the control circuitry 102.

Figure 2:
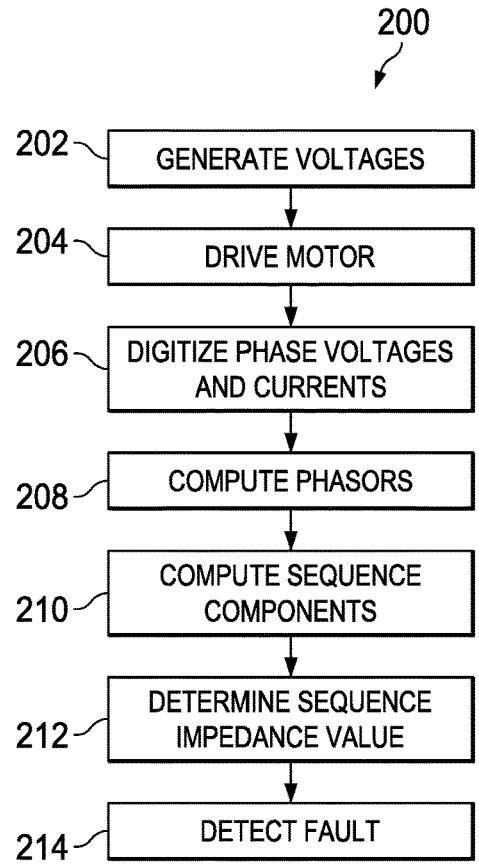
FIG. 2 shows a flow diagram for a method for using inverter harmonics to identify faults in a motor winding in accordance with various embodiments.

FIG. 2 shows a flow diagram for a method 200 for using inverter harmonics to identify faults in a motor winding in accordance with various embodiments. Though depicted sequentially as a matter of convenience, at least some of the actions shown can be performed in a different order and/or performed in parallel. Additionally, some implementations may perform only some of the actions shown. In some implementations, at least some of the operations of the method 200 can be implemented by the system 100.

In block 202, the PWM inverter circuitry 104 generates voltages $V_a$, $V_b$, and $V_c$, which induce currents $I_a$, $I_b$, and $I_c$ in the windings of the motor 106.

In block 204, the resulting phase currents $I_a$, $I_b$, and $I_c$ drive the motor 106.

In block 206, the time domain phase voltages $V_a$, $V_b$, and $V_c$, and phase currents $I_a$, $I_b$, and $I_c$ are filtered by the analog front end 110. The filtered phase voltages $V_a$, $V_b$, and $V_c$, and phase currents $I_a$, $I_b$, and $I_c$ are digitized by the ADC 108 in block 206. In block 208, the impedance estimation circuitry 126 converts the digitized phase voltages and currents into corresponding phasors.

In block 210, the impedance estimation circuitry 126 transforms the phasors to the voltage sequence components $V_p$, $V_n$, and $V_0$, and the current sequence components, $I_p$, $I_n$, and $I_0$. The voltage and current sequence components are related according to Equation (1).

$$\begin{bmatrix} V_p \\ V_n \\ V_0 \end{bmatrix} = \begin{bmatrix} Z_{pp} & Z_{pn} & Z_{p0} \\ Z_{np} & Z_{nn} & Z_{n0} \\ Z_{0p} & Z_{0n} & Z_{00} \end{bmatrix} \begin{bmatrix} I_p \\ I_n \\ I_0 \end{bmatrix} \quad (1)$$

In conventional systems, sequence impedance is computed at the fundamental electrical frequency ($\omega_e$). The terms of the impedance matrix in Equation (1) are a function of the electrical frequency $\omega_e$ and slip s (in the case of an AC induction motor)

$$\begin{bmatrix} Z_{pp} & Z_{pn} & Z_{p0} \\ Z_{np} & Z_{nn} & Z_{n0} \\ Z_{0p} & Z_{0n} & Z_{00} \end{bmatrix}^T = \left( \begin{bmatrix} I_{p1} & I_{p2} & I_{p3} \\ I_{n1} & I_{n2} & I_{n3} \\ I_{01} & I_{02} & I_{03} \end{bmatrix}^T \right)^{-1} \begin{bmatrix} V_{p1} & V_{n1} & V_{01} \\ V_{p2} & V_{n2} & V_{02} \\ V_{p3} & V_{n3} & V_{03} \end{bmatrix} \quad (2)$$

where the subscripts 1, 2, and 3 refer to three datasets collected at a given ($\omega_e$, s) operating point.

Rather than determining sequence impedance at the fundamental frequency as in conventional systems, embodiments of the system 100 compute sequence impedance at harmonic frequencies of the PWM inverter circuitry 104. By determining sequence impedance at inverter harmonic frequencies ($\omega_{ih}$), embodiments exploit the information contained in the voltage and current harmonics at higher frequencies. One advantage is that at inverter harmonic frequencies above the electrical frequency ($\omega_{ih} \gg W_e$), the inductive component of the impedance dominates the resistive component ($L\omega_{ih} \gg R$). Thus, the changes in the sequence impedance induced by a fault are dominated by the associated changes in inductive impedance. Because the change in impedance ($\Delta Z$) is higher at higher frequencies, embodiments can achieve a higher signal to noise ratio (SNR) leading to better fault detection rates and lower false alarm rates. This benefit is expressed in Equation (3), which compares the fault signature embedded in the inductive impedance of the present disclosure to conventional analysis.

$$(\Delta L)\omega_{ih} \gg (\Delta L)\omega_e \quad (3)$$

In block 212, the impedance estimation circuitry 126 employs the voltage and current sequence components to determine a sequence impedance value. For example, some embodiments of the impedance estimation circuitry 126 compute an absolute value of one or more off-diagonal sequence impedances such as an absolute value or square of an impedance value $Z_{np}$ ($|Z_{np}|$ or $|Z_{np}|^2$), $Z_{pn}$ ($|Z_{pn}|$ or $|Z_{pn}|^2$), or $Z_{p0}$ ($|Z_{p0}|$ or $|Z_{p0}|^2$). $Z_{np}$ represents the effect of positive sequence voltage on negative sequence current in the motor 106. $Z_{pn}$ represents the effect of negative sequence voltage on positive sequence current. $Z_{p0}$ represents the effect of zero sequence voltage on positive sequence current. Any off-diagonal sequence impedance value (or squared value thereof) can be computed or otherwise determined in block 210 which can be affected or excited by unbalanced voltage conditions at the motor 106, and thus can be monitored for use in load fault detection.

In block 214, the fault detection circuitry 112 applies the sequence impedance value to determine whether there is a fault in the windings of the motor 106. In some embodiments, the fault detection circuitry 112 compares the sequence impedance value to a threshold value. If the sequence impedance value exceeds the threshold value, then a fault is present in the windings of the motor 106, and some embodiments of the fault detection circuitry 112 transmit an indication of the fault to an external system (not shown) or to the control circuitry 102 to cause the control circuitry 102 to disable the PWM inverter circuitry 104 or take other corrective action.

Figure 3:
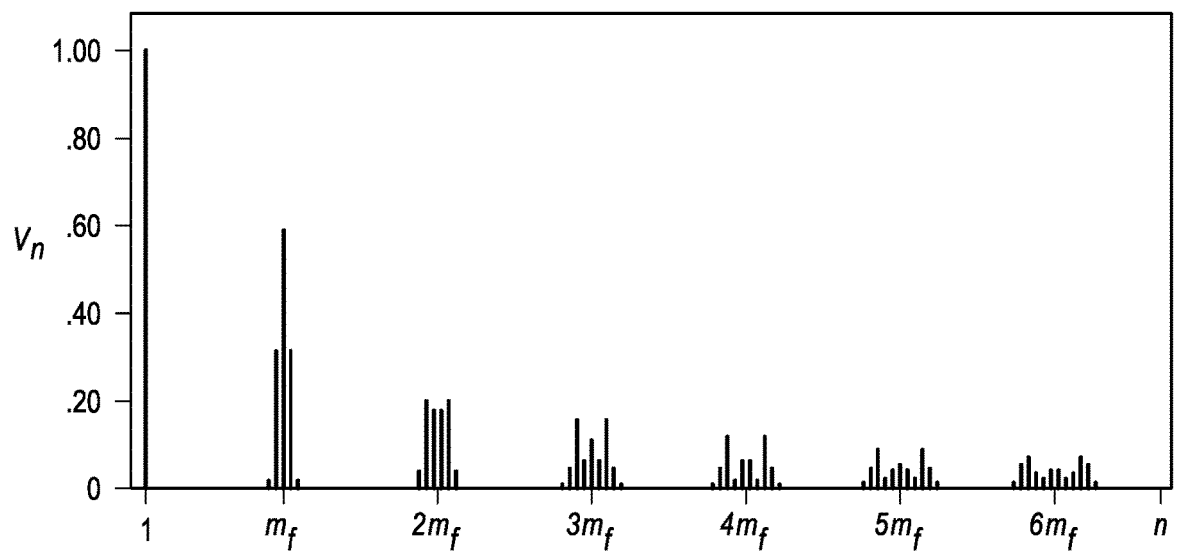
FIG. 3 shows a normalized frequency spectrum for a pulse width modulated signal in accordance with various embodiments.

FIG. 3 shows a normalized frequency spectrum for a pulse width modulated sinusoidal signal. On the normalized frequency axis, $n=\omega/\omega_e$. In a conventional system, low pass filters in the analog front end 110 filter the signals provided to the ADC 108 to remove the PWM frequencies above the fundamental. In the system 100, the sequence impedance can be computed at any of the higher order frequencies appearing around the PWM carrier frequency and its multiples (denoted by $m_f$, $2m_f$, etc. in FIG. 3). Typically, the signal strength around the carrier frequency ($m_f$) is strongest and contains the most useful information. Accordingly, some embodiments of the system 100 compute sequence impedance based on the signal around the PWM inverter carrier frequency.

Some embodiments of the impedance estimation circuitry 126 compute voltage and current sequence components in Equation (1) as shown in Equation (4)

$$V_p = \left( \frac{\tilde{V}_{as}(\omega_{ih}) + a\tilde{V}_{bs}(\omega_{ih}) + a^2\tilde{V}_{cs}(\omega_{ih})}{3} \right) \quad (4)$$

$$V_n = \left( \frac{\tilde{V}_{as}(\omega_{ih}) + a^2\tilde{V}_{bs}(\omega_{ih}) + a\tilde{V}_{cs}(\omega_{ih})}{3} \right)$$

$$I_p = \left( \frac{\tilde{I}_{as}(\omega_{ih}) + a\tilde{I}_{bs}(\omega_{ih}) + a^2\tilde{I}_{cs}(\omega_{ih})}{3} \right)$$

$$I_n = \left( \frac{\tilde{I}_{as}(\omega_{ih}) + a^2\tilde{I}_{bs}(\omega_{ih}) + a\tilde{I}_{cs}(\omega_{ih})}{3} \right)$$

where $a=e^{j2\pi/3}$.

Figure 4A:
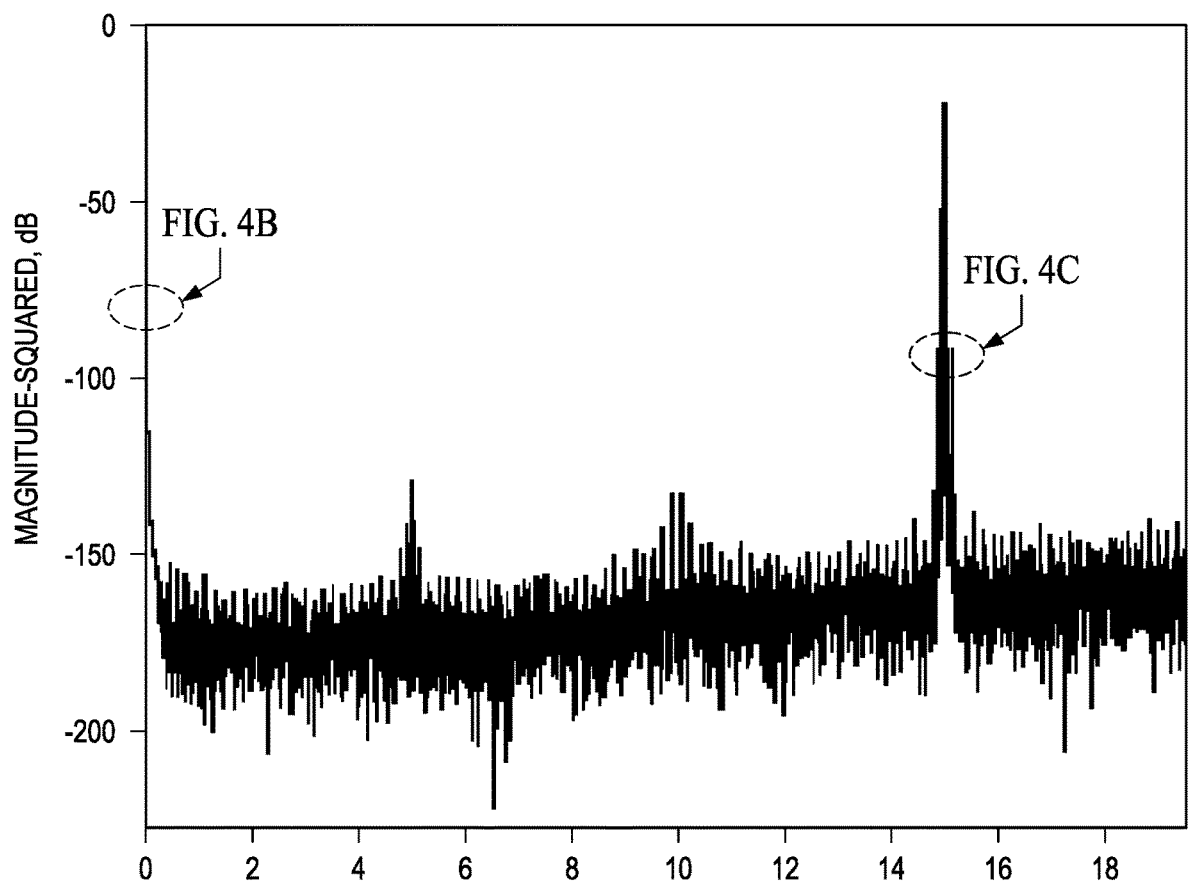
FIGS. 4A-4C show the current signal spectrum for a current signal generated by a pulse width modulated voltage waveform driven into a motor phase in accordance with various embodiments.
Figure 4B:
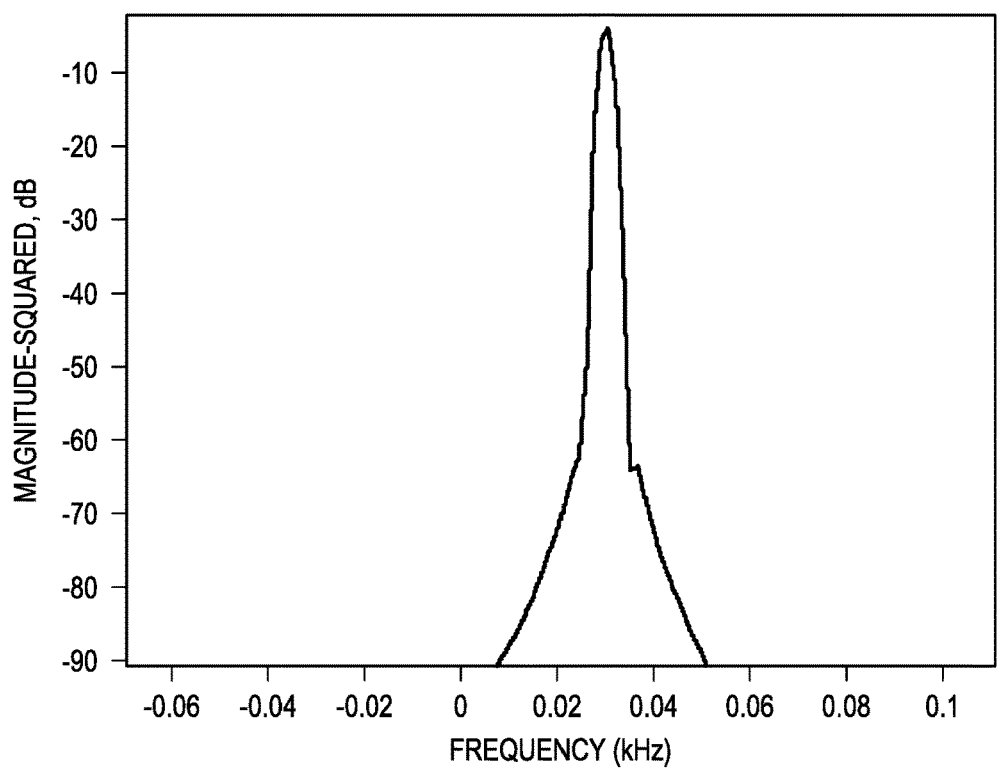
Figure 4C:
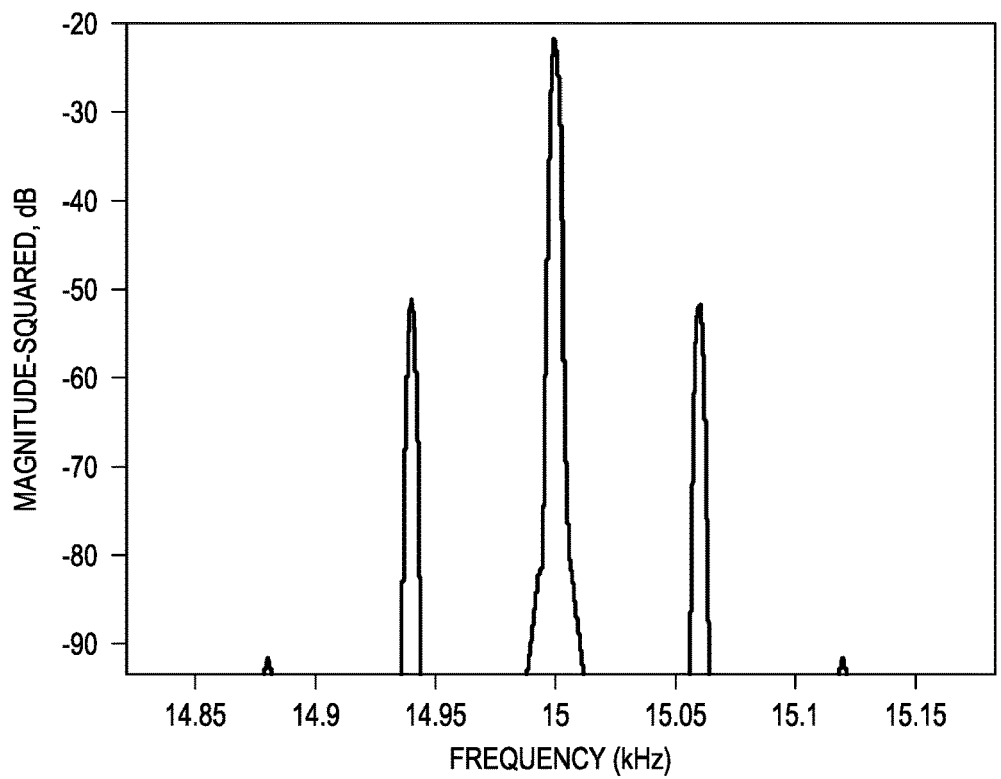

As indicated in Equation (4), the impedance estimation circuitry 126 computes the voltage and current phasors at $\omega_{ih}$. FIGS. 4A-4C show an example current signal spectrum for the motor 106 driven by the three phase PWM inverter circuitry 104 at a fundamental frequency of 30 Hz modulated with the PWM carrier signal at 15 kilo-Hz (kHz). FIG. 4A shows the spectrum from DC to just above the carrier frequency of the PWM inverter circuitry 104. FIG. 4B shows that the fundamental is at 30 Hertz (Hz). FIG. 4C shows the harmonics near the PWM carrier frequency of 15 kHz. The voltage signals 118 and the current signals 120 are filtered with low pass filters (e.g., 12-th order low pass filters with a cut-off frequency of 20 kHz) prior to digitization by the ADC 108. The ADC 108 samples the voltage and current signals at 50 kHz. FIG. 4C shows that the motor current includes, in addition to the fundamental component of the current at 30 Hz, higher order inverter harmonics near the PWM frequency band. The harmonics may be 40 to 60 decibels (dB) below the fundamental assuming that the PWM frequency is 2 to 3 decades above the motor R/L frequency. Such signal amplitudes are within the detectable range of a 12 to 16 bit ADC, such as the ADC 108.

In some embodiments of the system 100, the ADC 108 digitizes the signal corresponding to the higher order PWM harmonics at a sampling rate $F_S$, where $F_S > 2*(2\pi\omega_{ih})$. The corresponding filter bandwidth of the analog front end 110 is $W \approx 2\pi\omega_{ih}$. However, it is undesirable to increase the sampling rate of the ADC 108 just to enable better fault diagnostics because this higher sampling rate reduces the processing capacity available in a processor to carry out other tasks. Moreover, the key motor phenomena necessary for control occur at lower frequencies (hundreds of Hz), and increasing the sampling rate of the ADC 108 to twice the PWM carrier frequency or higher is an overdesign from a control perspective. To alleviate the burden of a high sampling rate in digitization of the signals 118 and 120, embodiments of the system 100 control the relationship of the sampling rate 114 ($F_S$) of the ADC 108, the PWM carrier frequency 112 ($F_C$), and the front end filter bandwidth 116 (W).

If ADC sampling is performed according to the Nyquist principle, a relatively high sampling rate may be required to determine the impedance at high frequency. To avoid high frequency sampling, embodiments of the system 100 control the sampling rate 114 ($F_S$) of the ADC 108, the PWM carrier frequency 112 ($F_C$), and the front end filter bandwidth 116 (W) to introduce aliasing in a predetermined manner. The impedance estimation circuitry 126 employs the aliased components to perform the sequence computations in Equation (4). The aliased components can subsequently be digitally filtered out of the signals provided to the control circuitry 102. To introduce aliasing in a band near $F_d$ in order to evaluate sequence impedance at frequency $F_{ih}$, (that is in the vicinity of the carrier frequency $F_C$), the ADC sampling frequency is selected such that:

$$F_S = F_{ih} - F_d \quad (5)$$

Figure 5A:
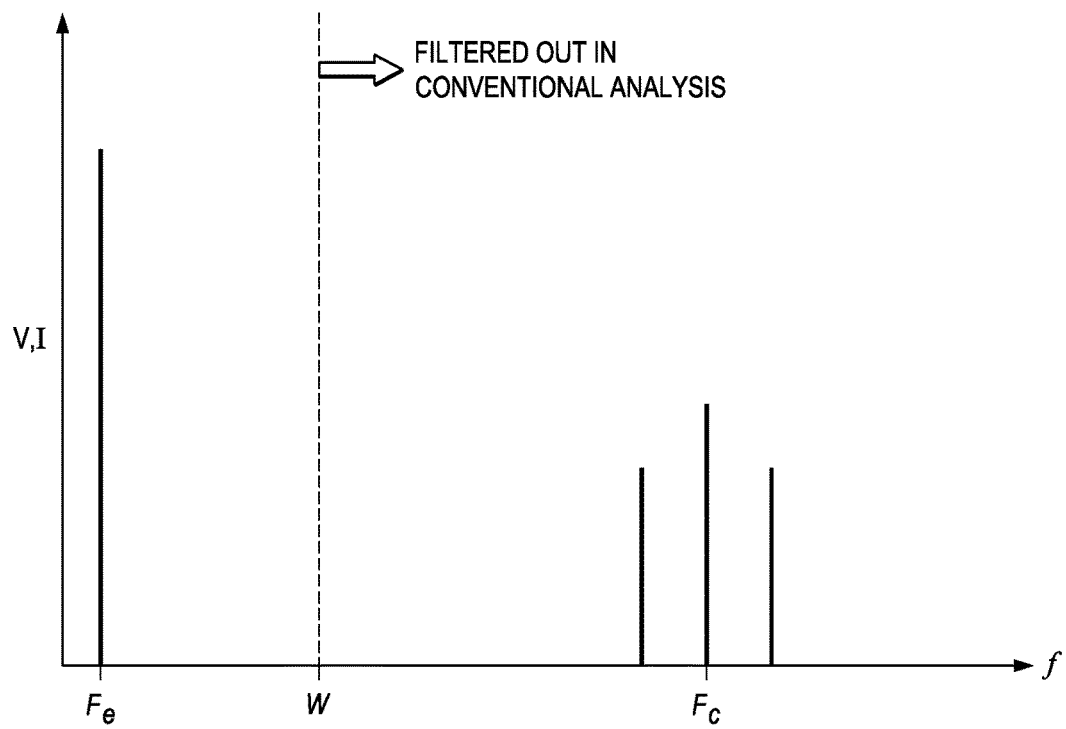
FIGS. 5A and 5B show inverter harmonics in conventional sequence analysis and in various embodiments of the system disclosed herein.
Figure 5B:
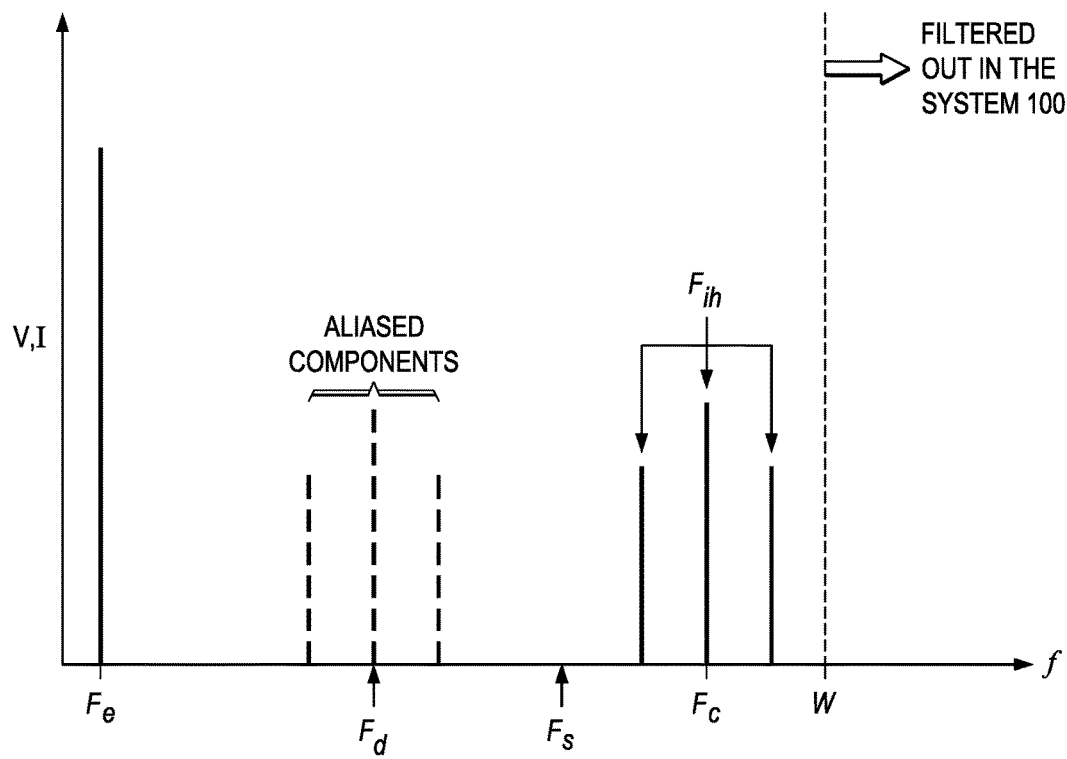

FIGS. 5A and 5B respectively show inverter harmonics filtered out in conventional sequence analysis that relies on the fundamental electrical frequency, and inverter harmonics not filtered out in various embodiments of the system 100. In FIG. 5A, the low pass filters in the analog front end 110 are configured to a bandwidth 116 (W) that passes frequency $F_e$ but rejects frequency $F_C$ and associated harmonic frequencies. The ADC 108 is set to sample the signals received from the analog front end 110 at a sampling rate $F_S$ suitable for digitization of frequencies below W. In this configuration, the harmonics generated by the PWM inverter circuitry 104 cannot be applied to monitor the operation of the motor 106, and advantages of the system 100 cannot be realized.

In FIG. 5B, the low pass filters in the analog front end 110 are configured to a bandwidth 116 (W) that passes PWM carrier frequency ($F_C$) and associated inverter harmonic frequencies ($\omega_{ih} = 2\pi F_{ih}$). A destination frequency ($F_d$) is selected, and the sampling frequency 114 of the ADC 108 is set in accordance with equation (5). Sampling at frequency ($F_S$) reflects the PWM carrier frequency ($F_C$) and associated harmonics ($F_{ih}$) to the destination frequency ($F_d$).

Some embodiments of the system 100 are configured such that $W \approx F_{ih}$. The sequence components from (4) are computed as shown in Equation (6)

$$V_p = \left( \frac{\tilde{V}_{as}(\omega_d) + a\tilde{V}_{bs}(\omega_d) + a^2\tilde{V}_{cs}(\omega_d)}{3} \right) \quad (6)$$

$$V_n = \left( \frac{\tilde{V}_{as}(\omega_d) + a^2\tilde{V}_{bs}(\omega_d) + a\tilde{V}_{cs}(\omega_d)}{3} \right)$$

$$I_p = \left( \frac{\tilde{I}_{as}(\omega_d) + a\tilde{I}_{bs}(\omega_d) + a^2\tilde{I}_{cs}(\omega_d)}{3} \right)$$

$$I_n = \left( \frac{\tilde{I}_{as}(\omega_d) + a^2\tilde{I}_{bs}(\omega_d) + a\tilde{I}_{cs}(\omega_d)}{3} \right)$$

where $\omega_d = 2\pi F_d$.

Modifications are possible in the described embodiments, and other embodiments are possible, within the scope of the claims.

What is claimed is:

1. A controller, comprising:
   an analog-to-digital converter (ADC) having ADC inputs and ADC outputs, the ADC inputs adapted to be coupled to phase windings of a motor, the ADC configured to provide digital values at the ADC outputs responsive to voltages and currents from the phase windings; and
   fault detection circuitry having circuitry inputs and impedance estimation circuitry, the circuitry inputs coupled to the ADC outputs, and the fault detection circuitry configured to:
   using the impedance estimation circuitry, determine phasor values at a harmonic frequency responsive to the digital values, and determine a sequence impedance value based on the phasor values; and
   identify a fault in the phase windings based on the sequence impedance value.

2. The controller of claim 1, further comprising a multiphase driver having driver outputs adapted to be coupled to the phase windings.

3. The controller of claim 2, wherein the multiphase driver is configured to generate pulse width modulated signals at the driver outputs.

4. The controller of claim 1, wherein the harmonic frequency is an inverter harmonic frequency.

5. The controller of claim 4, wherein the phase windings are driven by voltage and current signals, and the inverter harmonic frequency includes one or more harmonic frequencies centered at a carrier frequency of the voltage and current signals.

6. The controller of claim 4, wherein the inverter harmonic frequency is higher than a digitizing frequency of the ADC.

7. The controller of claim 4, wherein a digitizing frequency of the ADC is a difference between the inverter harmonic frequency and a particular frequency below the digitizing frequency of the ADC.

8. The controller of claim 4, wherein the fault detection circuitry is configured to process the digital values at an alias frequency of the inverter harmonic frequency.

9. A system, comprising:
   low-pass filters having filter inputs and filter outputs, the filter inputs adapted to be coupled to windings of a motor, the windings driven by voltage and current signals having frequency components, and the low-pass filters configured to: modify the voltage and current signals by attenuating ones of the frequency components above a cut-off frequency; and provide the modified voltage and current signals at the filter outputs;
   an analog to digital converter (ADC) having ADC inputs and ADC outputs, the ADC inputs coupled to the filter outputs, and the ADC configured to provide digital values at the ADC outputs responsive to the modified voltage and current signals; and
   a processor having processor inputs coupled to the ADC outputs, the processor configured to:
   responsive to the digital values, determine phasor values at an inverter harmonic frequency of the voltage and current signals; determine a sequence impedance value based on the phasor values; and identify a fault in the windings based on the sequence impedance value.

10. The system of claim 9, wherein the inverter harmonic frequency includes one or more harmonic frequencies centered at a carrier frequency of the voltage and current signals.

11. The system of claim 9, wherein a corner frequency of the low-pass filter is higher than a carrier frequency of the voltage and current signals.

12. The system of claim 9, wherein the inverter harmonic frequency is higher than a digitizing frequency of the ADC.

13. The system of claim 9, wherein a digitizing frequency of the ADC is a difference between the inverter harmonic frequency and a particular frequency below the digitizing frequency of the ADC.

14. The system of claim 9, wherein the processor is configured to process the digital values at an alias frequency of the inverter harmonic frequency.

15. The system of claim 9, further comprising a multiphase driver having driver outputs adapted to be coupled to the windings.

16. The system of claim 15, wherein the multiphase driver is configured to generate pulse width modulated signals at the driver outputs.

* * * * *